United States Patent [19]

Nonaka et al.

[11] 4,377,900

[45] Mar. 29, 1983

[54] METHOD OF MANUFACTURING SEMICONDUCTOR DEVICE

[75] Inventors: Terumoto Nonaka; Tadahiko Hotta, both of Hamamatsu, Japan

[73] Assignee: Nippon Gakki Seizo Kabushiki Kaisha, Hamamatsu, Japan

[21] Appl. No.: 257,664

[22] Filed: Apr. 27, 1981

[30] Foreign Application Priority Data

Apr. 28, 1980 [JP] Japan ................................. 55/56731

[51] Int. Cl.³ .......................................... H01L 21/223
[52] U.S. Cl. ................................ 29/571; 29/577 C; 148/187
[58] Field of Search ................. 29/571, 577 C, 576 B, 29/576 E; 148/187, 1.5; 357/23

[56] References Cited

U.S. PATENT DOCUMENTS 3,472,712 10/1969 Bower ............................. 29/571 X
3,847,687 11/1974 Davidsohn ......................... 148/187
4,125,156 7/1980 Dalal et al. ........................ 427/42

Primary Examiner—G. Ozaki
Attorney, Agent, or Firm—Spensley, Horn, Jubas & Lubitz

[57] ABSTRACT

A method of manufacturing an SIT or SITL device, comprising simultaneous formation of a gate doping aperture and contact apertures for a source and a drain. Firstly, a gate region is doped through the doping aperture with the contact apertures being covered by a mask. Then, a source region is doped so as to be in self-alignment relation relative to the gate region and a source contact portion is doped so as to be in self-alignment relation relative to the source region and the gate region, whereby the mask alignments are eliminated and packing density is enhanced.

18 Claims, 6 Drawing Figures

METHOD OF MANUFACTURING SEMICONDUCTOR DEVICE

BACKGROUND OF THE INVENTION (a) Field of the Invention

The present invention relates to a method of manufacturing a semiconductor device such as a static induction transistor and a semiconductor integrated circuit device in which such static induction transistor or transistors are integrated.

(b) Description of the Prior Art

Conventional method of manufacturing a static induction transistor or a static induction transistor logic device (hereinafter referred to as SITL device) usually comprises the following steps: (1) forming an aperture in the SiO$_2$ film covering the entire surface of a semiconductor an aperture for doping a gate-forming-impurity so as to surround a channel region; thereafter, (2) forming a gate region by selectively diffusing the impurity through said aperture and at the same time therewith defining a region which will serve as a source region surrounded by said gate region; next, (3) after aligning a diffusion mask relative to the gate region, forming the source region within said region adapted to become the source region by selectively diffusing an impurity; and (4) after aligning an etching mask relative to said gate region, said source region and a drain region, forming contact apertures for these respective regions, and forming a gate contact, a source contact and a drain contact.

According to the conventional method described above, it was necessary to perform mask alignments twice for the gate region when the source region and the source contact portion are formed. Thus, this method not only has been troublesome and complicated in terms of steps, but also there has been required a surplus area on the surface of the substrate to provide for some marginal area for mask alignments. Accordingly, there has been a limitation to the minuteness of the circuit structure of the device, and the packing density has been limited greatly. Also, there has been the further inconvenience that, in order to establish self-alignment of the source region and the gate region, the number of masking steps had to be increased.

SUMMARY OF THE INVENTION

A basic object of the present invention is to provide a method of manufacturing a semiconductor device which simplifies the masking step in the manufacturing process.

A first object of the invention is to provide a method of manufacturing a semiconductor device as described above, which eliminates the necessity to perform mask alignments for masking the gate region and the provision of marginal space for mask alignments in case the source region and the source contact portion are formed.

A second object of the present invention is to provide a method of manufacturing a semiconductor device as described above, in which, at the time of formation of the source region, this source region is self-aligned relative to the gate region.

A third object of the present invention is to provide a method of manufacturing a semiconductor device as described above, in which, at the time the source contact portion is formed, this source contact portion is self-aligned relative to the source region and the gate region.

A fourth object of the present invention is to provide a method of manufacturing a semiconductor device as described above, such that, owing to the elimination of the marginal space in the surface of the semiconductor substrate for masking, the packing density of the device is improved.

DETAILED DESCRIPTION OF THE PREFERRED EMBODIMENTS

The present invention will hereunder be described with respect to a preferred embodiment thereof by referring to the accompanying drawings.

FIGS. 1 to 6 show the steps of manufacturing an SITL device representing an embodiment of the present invention. The respective steps are detailed as follows.

Figure 1:
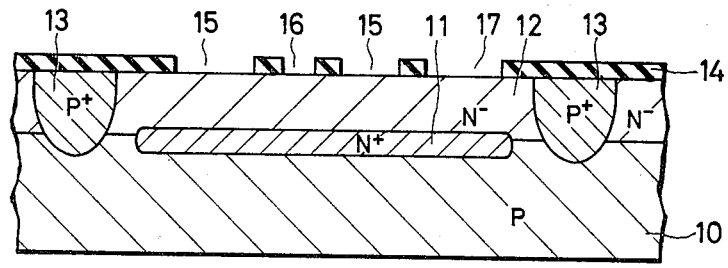
FIGS. 1 to 6 show vertical sections of the semiconductor substrate, illustrating the successive steps of manufacturing an SITL device embodying the present invention though an additional or injector transistor is not shown.

(1) By relying on a conventional technique, an n$^-$ type silicon epitaxial growth semiconductor layer 12 is formed, leaving an n$^+$ type buried layer 11, on a surface of a p type semiconductor substrate 10. And then, a p type impurity such as boron is selectively diffused into the n$^-$ type semiconductor layer 12 so as to reach the substrate 10 to thereby form a p$^+$ type isolation region 13. During the above-mentioned steps, usually SiO$_2$ film is thermally grown on the upper surface of the layer 12. Of course, another SiO$_2$ film may be freshly formed in addition to or separately from the above-said SiO$_2$ film. Either of these SiO$_2$ films is illustrated conveniently as an insulation film 14 in FIG. 1. This insulation film 14 is then subjected to simultaneous formation of a closed loop-shaped aperture 15 for gate-doping by relying on a known photolithographic technique, an aperture 16 for source contact and surrounded by said gate-doping aperture 15, and an aperture 17 positioned separately from and on the outside of said aperture 15, to serve as a drain contact aperture, as shown in FIG. 1.

Figure 2:
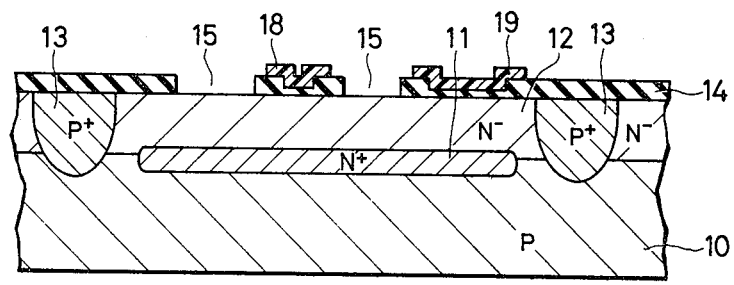
Figure 3:
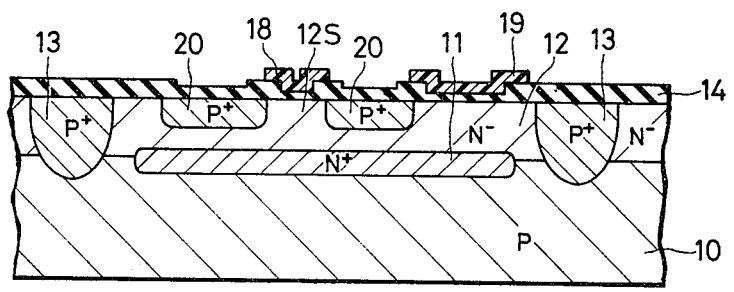

(2) Next, the exposed surface portions of the n$-$ type semiconductor layer 12 is oxidized for a very short depth, and thereafter the resulting entire upper surface of the substrate is covered with a silicon nitride (Si$_3$N$_4$) by relying on a conventional CVD (Chemical Vapor Deposition) technique. Thereafter, there are formed masking layers 18 and 19 made of Si$_3$N$_4$ through patterning by relying on a photolithographic technique so as to retain the covered silicon nitride on the contact apertures 16 and 17. During this step, the gate-doping aperture 15 is exposed. Subsequently, the thin SiO$_2$ film provided on the surface of the semiconductor body defined in the doping aperture 15 is etched away. FIG. 2 shows the article at this state. It should be noted here that the thin SiO$_2$ film disposed beneath the masking layers 18 and 19 serves to mitigate thermal stress which can develop due to the difference in thermal expansion coefficient between silicon and silicon nitride.

(3) Then, boron is selectively diffused (more particularly it is driven-in after deposition of same) into the n$-$ type semiconductor layer 12 through the doping aperture 15, to thereby form a p$+$ type impurity-doped gate region 20. Concurrently therewith, a region 12S for source region surrounded by said doped region 20 is defined. During this step, a fresh SiO$_2$ film is formed, by a thermal process for driving-in the p type impurity of the gate region 20, on that portion of the surface of the semiconductor body located within the doping aperture 15. This SiO$_2$ film will have a thickness greater than that of the SiO$_2$ film provided beneath the masking layers 18 and 19, since oxidization of silicon is more facilitated at the exposed surface in the doping aperture 15 than the potions covered by the masking layers 18 and 19. See FIG. 3. Subsequently, these masking layers 18 and 19 and the thin SiO$_2$ film disposed beneath them are etched away successively.

Figure 4:
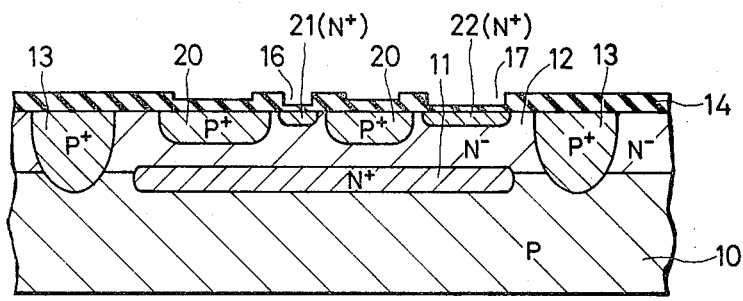

(4) Next, an n type impurity such as phosphorous or arsenic is selectively diffused (it is driven-in after deposition of same) into the n— type semiconductor layer 12 via the contact apertures 16 and 17 to form an n+ type doped region 21 for source region and an n+ type doped region 22 for drain contact as shown in FIG. 4. In this step, the source region 21 and the drain region 22 are rendered into self-alignment relationship relative to the gate region 20, and a fresh thin SiO$_2$ film is formed on that portions of the surface of the semiconductor body located within the contact apertures 16 and 17 due to a thermal process for driving-in the n type impurity.

Figure 5:
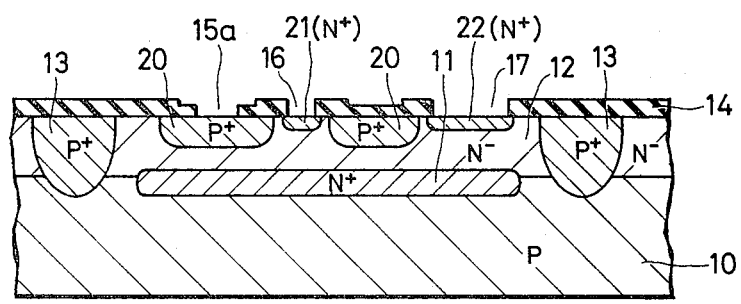

(5) Thereafter, a gate contact aperture 15a is formed by selective etching technique using, for example, a photoresist as a mask. Concurrently therewith, the thin SiO$_2$ film located within the contact apertures 16 and 17 is etched away as shown in FIG. 5. As a result, there are exposed, in the respective contact apertures 15a, 16 and 17, corresponding portions of the surface of the semiconductor body, respectively.

Figure 6:
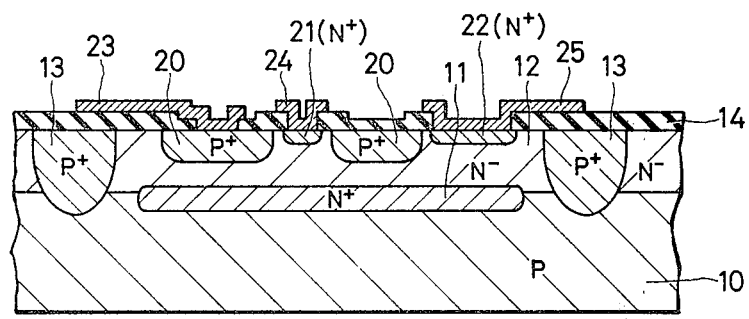

(6) A electrode metal such as aluminum is deposited on the entire upper surface of the substrate. By appropriate patterning of this deposited metal, there are formed a gate electrode layer 23, a source electrode layer 24 and a drain electrode layer 25 as shown in FIG. 6. In this step, the source contact area between the source region 21 and the source electrode layer 24 is rendered into self-alignment relationship relative to the source region 21 and to the gate region 20. Also, the drain contact area between the drain region 22 and the drain electrode layer 25, too, is rendered into self-alignment relationship relative to the drain region 22 and the gate region 20.

In the above-described embodiment, the n— type semiconductor layer 12 has a low impurity concentration, such as $1 \times 10^{19}$ to $1 \times 10^{21}$m$^{-3}$, for the purpose of the formation of a static induction transistor, so that the formation of the isolation region 13 can be accomplished by a processing which is conducted at the same time with the selective diffusion intended to form the doped region 20 for the formation of the gate region. Also, in case a Schottky junction is required, the contact cutting step shown in FIG. 5 may be utilized, so that it is possible to form a Schottky junction at any desired location. It should be understood here that the above-said selective doping of impurity may be accomplished by selective ion-implantation technique, instead of the above-described selective diffusion technique.

It should be understood also that an operation by reversing the function of the source region and the drain region is possible.

What is claimed is:

1. A method of manufacturing a semiconductor device comprising:
   a first step of forming, by relying on photolithographic techniques, a doping first aperture and a contact second aperture in an insulation film covering a surface of a semiconductor body having a first conductivity type;
   a second step of forming a first doped region having a second conductivity type opposite to said first conductivity type in a surface portion of said semiconductor body corresponding in position to said doping first aperture, by selectively doping an impurity into said semiconductor body through said doping first aperture in a state that said contact second aperture is covered by a selectively removable masking layer; and
   a third step of forming a second doped region having said first conductivitiy type in a surface portion of said semiconductor body corresponding in position to said contact second aperture, by selectively removing said masking layer and then doping an impurity into said semiconductor body through said contact second aperture.

2. A method according to claim 1, in which: said doping first aperture and said contact second aperture are formed simultaneously.

3. A method according to claim 1, in which:
   prior to formation of said doping first aperture and said contact second aperture in said first step, an isolation region having said second conductivity type is formed in said semiconductor body.

4. A method according to claim 3 in which:
   said isolation region is formed so as to be positioned outside a region containing said doping first aperture and said contact second aperture.

5. A method according to claim 1 in which:
   said doping first aperture in said first step is provided as a closed loop gate doping aperture, and said contact second aperture is surrounded by said gate doping aperture, and in said first step there is also provided a contact third aperture outside said gate doping aperture.

6. A method according to claim 5, in which: by the formation of said first doped region in said second step, there is concurrently defined the portion for said second region in the semiconductor body surrounded by said first doped region.

7. A method according to claim 6, in which: said first doped region is used as a region to serve as a gate, and said second region is used as a region to serve as either one of a source and a drain.

8. A method according to claim 5, in which:
   said second doped region in said third step is provided in two portions, one of which is a doped region to serve as a source which is formed corresponding in position to one of said contact first or third apertures and the other is a doped region to serve as a drain which is formed in correspondence in position to the other of said contact first and third apertures.

9. A method according to claim 8, in which: the surface of said semiconductor body is exposed at locations corresponding to said gate doping aperture and, said contact first and third apertures, and thereafter by deposition of an electrode metal and by patterning the deposited metal, there are formed a gate electrode layer, a source electrode layer and a drain electrode layer.

10. A method according to claim 9, in which: a Schottky junction is selectively formed between said gate electrode layer and said gate region, between said source electrode layer and said doped region serving as a source, and between said drain electrode layer and said doped region serving as a drain.

11. A method according to claim 1, in which: said masking layer in said second step is formed by preliminarily forming a thin oxide film on a surface of said semiconductor body, thereafter forming thereon a silicon nitride layer, thereafter selectively removing said silicon nitride layer leaving that portion of said silicon nitride layer covering said contact second aperture, so that said thin oxide film and said silicon nitride layer are laminated successively on said contact second aperture.

12. A method according to claim 11, wherein: said silicon nitride layer is made of $Si_3N_4$ and formed by relying on a chemical vapor deposition technique.

13. A method according to claim 1, in which: the doping of said first doped region and said second doped region each is acomplished by relying on a technique selected from diffusion technique or ion-implantation technique.

14. A method according to claim 1, in which: said semiconductor body having said first conductivity type has an impurity concentration in the range of $1 \times 10^{19}$ to $1 \times 10^{21} m^{-3}$.

15. A method of manufacturing a semiconductor device comprising the steps of:
concurrently forming a gate aperture, a source aperture and a drain aperture in an insulating film covering a semiconductor body,
providing a mask over said source and drain apertures, said mask being selectively etchable with respect to said insulating film,
first doping said body through said gate aperture to form a gate region within said body while retaining said mask over said source and drain apertures,
forming an insulating film in said gate aperture either concurrently with or subsequent to said first doping step,
selectively removing said mask to expose said source and drain apertures while leaving said insulating film in said gate aperture, and
second doping said body through said source and drain apertures to form respective source and drain regions within said body, said source and drain regions thereby being self-aligned with said gate region without the use of a separate source and drain defining mask.

16. The method of claim 15 wherein during said second doping step a thin insulating film is produced in said source and drain apertures, and comprising the further steps of:
removing the thin insulating film from said source and drain apertures while leaving the insulating film over the rest of said body substantially intact,
forming, concurrently with said removing step, an opening through said insulating film to said gate region using a mask, and
providing contacts to said source, drain and gate regions respectively through said source and drain apertures and said opening.

17. The method of claim 16 wherein during said second doping step a thin insulating film is produced in said source and drain apertures, and comprising the further steps of:
removing the thin insulating film from said source and drain apertures while leaving the insulating film over the rest of said body substantially intact,
forming, subsequent to said removing step, an opening through said insulating film to said gate region using a mask, and
providing contacts to said source, drain and gate regions respectively through said source and drain apertures and said opening.

18. The method of claim 17 wherein said step of providing a mask comprises:
initially providing a thin film of silicon dioxide over said source and drain apertures, and
thereafter providing a layer of silicon nitride over said silicon dioxide thin layer.

* * * * *